(12) United States Patent
Hashimoto

(10) Patent No.: US 8,080,447 B2
(45) Date of Patent: Dec. 20, 2011

(54) METHOD OF MANUFACTURING SEMICONDUCTOR DEVICE INCLUDING EXPOSING A DICING LINE ON A WAFER

(75) Inventor: Nobuaki Hashimoto, Suwa (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 12/842,080

(22) Filed: Jul. 23, 2010

(65) Prior Publication Data

US 2010/0304533 A1 Dec. 2, 2010

Related U.S. Application Data

(62) Division of application No. 11/200,304, filed on Aug. 9, 2005, now abandoned, and a division of application No. 11/931,109, filed on Oct. 31, 2007, now abandoned.

(30) Foreign Application Priority Data

Sep. 15, 2004 (JP) .................................. 2004-268116
Mar. 25, 2005 (JP) .................................. 2005-088713
Jul. 20, 2005 (JP) .................................. 2005-210056

(51) Int. Cl.
*H01L 21/82* (2006.01)

(52) U.S. Cl. ................................. 438/110; 257/E21.602

(58) Field of Classification Search .................. 438/108, 438/113, 114, 118, 127, 110; 257/E21.602
See application file for complete search history.

(56) References Cited

U.S. PATENT DOCUMENTS

| | | | |
|---|---|---|---|
| 5,318,651 A | 6/1994 | Matsui et al. | |
| 5,384,952 A * | 1/1995 | Matsui | ............................ 29/840 |
| 5,925,936 A | 7/1999 | Yamaji | |
| 6,100,597 A | 8/2000 | Nakamura | |
| 6,117,347 A | 9/2000 | Ishida | |
| 6,177,731 B1 | 1/2001 | Ishida et al. | |
| 6,207,473 B1 * | 3/2001 | Hirai et al. | ..................... 438/106 |
| 6,326,234 B1 | 12/2001 | Nakamura | |
| 6,455,920 B2 | 9/2002 | Fukasawa et al. | |

(Continued)

FOREIGN PATENT DOCUMENTS

JP 04-032171 2/1992

(Continued)

OTHER PUBLICATIONS

Communication from Korean Patent Office regarding related application.

*Primary Examiner* — N Drew Richards
*Assistant Examiner* — Daniel Shook
(74) *Attorney, Agent, or Firm* — Harness, Dickey & Pierce, P.L.C.

(57) ABSTRACT

A method of manufacturing a semiconductor device, including the following steps, forming a resin layer on a surface of a semiconductor chip, the surface is provided with a bump formed thereon, the resin layer having photosensitivity and adhesiveness, exposing an upper surface of the bump by removing a part of the resin layer right above the bump by exposing and then developing the resin layer, and bonding the semiconductor chip provided with a resin film formed of the resin layer face-down to a substrate, the bump of the semiconductor chip and a conductive section of the substrate being electrically connected by the resin film functioning as an adhesive.

5 Claims, 3 Drawing Sheets

U.S. PATENT DOCUMENTS

| | | |
|---|---|---|
| 6,590,274 B2 | 7/2003 | Ohsumi et al. |
| 6,670,264 B2 | 12/2003 | Sakuyama et al. |
| 6,841,420 B2 | 1/2005 | Ohuchi |
| 6,873,056 B2 | 3/2005 | Sakuyama et al. |
| 6,905,915 B2 | 6/2005 | Yuzawa |
| 6,919,646 B2 | 7/2005 | Ohuchi |
| 2002/0027257 A1 | 3/2002 | Kinsman et al. |
| 2003/0001283 A1 | 1/2003 | Kumamoto |
| 2005/0028361 A1 | 2/2005 | Yin et al. |

FOREIGN PATENT DOCUMENTS

| | | |
|---|---|---|
| JP | 04-082241 | 3/1992 |
| JP | 04-176137 | 6/1992 |
| JP | 09-283566 | 10/1997 |
| JP | 10-144733 | 5/1998 |
| JP | 11-288971 | 10/1999 |
| JP | 11-330160 | 11/1999 |
| JP | 2000-012622 | 1/2000 |
| JP | 2001-052323 | 2/2001 |
| JP | 2001-077231 | 3/2001 |
| JP | 2003-204148 | 7/2003 |
| JP | 2003-243448 | 8/2003 |
| JP | 2003-338525 | 11/2003 |
| JP | 2004-200195 | 7/2004 |
| KR | 10-0551607 | 2/2006 |

* cited by examiner

METHOD OF MANUFACTURING SEMICONDUCTOR DEVICE INCLUDING EXPOSING A DICING LINE ON A WAFER

RELATED APPLICATIONS

This application is a divisional of U.S. patent application Ser. No. 11/931,109 filed Oct. 31, 2007, which is a divisional of U.S. patent application Ser. No. 11/200,304 filed Aug. 9, 2005. This application claims the benefit of Japanese Patent Application Nos. 2004-268116 filed Sep. 15, 2004; 2005-088713 filed Mar. 25, 2005; and 2005-210056 filed Jul. 20, 2005. The disclosures of the above applications are incorporated herein by reference.

BACKGROUND OF THE INVENTION

1. Technical Field

The present invention relates to a semiconductor device equipped with a semiconductor chip, a method of manufacturing the semiconductor device by a face-down bonding process, and a mounting structure of the semiconductor device.

2. Related Art

As a mounting method of a semiconductor chip by a face-down bonding process, a method using an anisotropic conductive membrane (See, for example, Japanese Unexamined Patent Publication No. 4-32171.) composed of anisotropic conductive paste (ACP) or an anisotropic conductive film (ACF) and a method using insulation resin for bonding (See, for example, Japanese Unexamined Patent Publication No. 4-82241.) composed of insulating nonconductive paste (NCP) or a nonconductive film (NCF) are known. In such methods using resin as an adhesive, when a semiconductor chip is mounted on a substrate, the resin, namely thermoset resin or light curing resin, is previously provided on the substrate. And, then the semiconductor chip is set on the substrate and fixed thereon by further executing a pressure heating process.

However, in such a method in which the resin provided to the substrate side is used as the adhesive, a dedicated coating device is required in case, for example, the resin is in a paste form, or another dedicated coating device in case the resin is in a film form. Therefore, the dedicated devices required therefor problematically raise the mounting cost.

Further, in the method in which the resin is provided to the substrate side and the semiconductor chip is bonded thereon by a face-down bonding process, since a bump of the semiconductor chip is connected to a land (a conductive section) on the substrate while pushing through the resin to move aside, the resin (the adhesive) cannot be prevented from remaining between the land and the bump. And, the land and the bump could be exfoliated from each other because of the difference in the thermal expansion coefficient between the residual resin and the land or the bump, thus problematically lowering the mounting reliability. Further, the contact resistance between the land and the bump is problematically enlarged by the residual resin.

Still further, since the semiconductor chip pushes the resin (the adhesive) to run aside when bonding the semiconductor chip by a face-down boding process, another component to be positioned adjacent to the semiconductor chip cannot be disposed at the nearest position, which results in a dead space on the substrate, thus making a cause of degrading high-density mounting.

SUMMARY

In view of the above circumstances, the present invention offers an advantage of providing a method of manufacturing a semiconductor device, a mounting structure of the semiconductor, and a semiconductor device preferably used for the method and the mounting structure, all capable of enabling the face-down bonding without requiring any dedicated devices, and making an electrical connection between the land and the bump reliable to enhance the mounting reliability, and further eliminating dead spaces from the substrate to realize the high-density mounting.

According to a first aspect of the invention, a method of manufacturing a semiconductor device includes the following steps; forming a resin layer on a surface of a semiconductor chip, the surface is provided with a bump formed thereon, the resin layer having photosensitivity and adhesiveness, exposing an upper surface of the bump by removing a part of the resin layer right above the bump by exposing and then developing the resin layer, and bonding the semiconductor chip provided with a resin film formed of the resin layer face-down to a substrate, the bump of the semiconductor chip and a conductive section of the substrate being electrically connected by the resin film functioning as an adhesive.

According to the method of manufacturing the semiconductor device, since the resin film functioning as an adhesive is formed on the semiconductor chip, the resin layer for forming the resin film can be formed by a process using a multi-purpose device such as a spin coating process and no dedicated device is required, thus the mounting cost can be reduced.

Further, since the semiconductor chip is directly bonded face-down to the substrate with the upper surface of the bumps exposed to electrically connect the bumps to the lands of the substrate, the resin is prevented from entering between the lands and the bumps, and accordingly, the lands and the bumps can be prevented from peeling off from each other, thus enhancing the mounting reliability and also reducing the contact resistance between the lands and the bumps.

Further, since the semiconductor chip is bonded face-down by making the resin film having adhesiveness function as an adhesive, namely by cooling to resolidify the resin film after heating to melt it, or by hot-curing it, resin forming the resin film can hardly run off to the sides of the semiconductor chip in the face-down bonding process, and accordingly, a dead space can hardly be created on the substrate, thus realizing high-density mounting.

Further, in the method of manufacturing a semiconductor device, a resin forming the resin layer is a photosensitive and thermoplastic resin or a precursor of the photosensitive and thermoplastic resin, and the method preferably comprises heating the resin layer to change the resin forming the resin layer into the resin film formed of a thermoplastic resin.

By thus configured, the resin film exerts its adhesiveness in good conditions and can function as an adhesive in good conditions.

Note that in the manufacturing method of the semiconductor, a photosensitive and thermoplastic resin forming the resin layer or a material of the photosensitive and thermoplastic resin including a precursor of the photosensitive and thermoplastic resin preferably includes a thermoset resin or a component of the thermoset resin.

By thus configured, the heat resistivity of the insulating film is improved to enhance the reliability.

Further, in the manufacturing method of a semiconductor device, the resin layer can be formed of a photosensitive thermoset resin adhesive sheet.

By thus configured, since, for example, the resin layer formed of the photosensitive thermoset resin adhesive sheet can directly be form the resin film having adhesiveness, the processes can be simplified and accordingly, the productivity is enhanced.

Further, in the method of manufacturing a semiconductor device described above, a number of the semiconductor chips are integrally formed on a wafer, and a part of the resin layer right above a dicing line of the wafer is removed simultaneously in the exposing step to expose the dicing line.

Although it is very difficult to dice the resin together with the wafer made of silicon, by exposing the dicing lines 4 by removing the resin as described above, the wafer 1 can easily be diced as before by a dicing saw or the like.

Further, in the method of manufacturing a semiconductor device described above, if a mark is formed on the semiconductor chip, a part of the resin layer right above the mark on the semiconductor chip is removed simultaneously in the exposing step to expose the mark.

If various marks such as dicing mark or bonding mark are formed on the semiconductor chip, the semiconductor chip can be handled in the same manner as the ordinary semiconductor chip by exposing the marks.

Further, in the manufacturing method of a semiconductor device, in the bonding step, the bump is electrically connected to the conductive section via a brazing filler metal.

By thus configured, the conductive section of the substrate and the bump of the semiconductor chip pulled in each other by adhesive force of the resin film, namely by shrinking force generated by solidifying the melted resin film, to be contacted to each other, are further connected to each other via the brazing filler metal, thus obtaining a stronger junction. Further, since the brazing filler metal can be melted by the heat for melting the resin film, and then can be solidified as it is by the cooling process (natural cooling) for resolidifying the resin film, an additional load in the processes is hardly caused by adding the brazing filler metal.

According to another aspect of the invention, a semiconductor device equipped with a semiconductor chip having a bump, includes a resin film made of adhesive resin provided on a surface of the semiconductor chip provided with a bump formed thereon so as to expose an upper surface of the bump.

According to the semiconductor device, the semiconductor chip can be bonded face-down on the substrate by making the resin film composed of adhesive resin function as an adhesive, namely, by resolidifying the resin film once hot-melted. Further in this case, since there is a very little chance for the resin composing the resin film to run off to the sides of the semiconductor chip, a dead space can hardly be created on the substrate, therefore, by using the semiconductor device, the high-density mounting can be realized.

Still further, the resin layer for forming the resin film can be formed by a method using multi-purpose devices such as a spin-coating process, and accordingly, by using the semiconductor device, any dedicated devices for mounting can be eliminated, thus making the mounting cost be reduced.

Further, since the upper surface of the bump of the semiconductor is exposed, by bonding the semiconductor chip face-down directly on the substrate to electrically connect the bump to the conductive section of the substrate, the resin can be prevented from entering between the conductive section and the bump. As a result, peeling-off of the conductive section from the bump can be prevented to enhance the reliability in mounting, and the contact resistance between the conductive section and the bump can also be reduced.

Further, in the semiconductor device, the adhesive resin is preferably thermoplastic resin.

By thus configured, the resin film exerts its adhesiveness in good conditions and can function as an adhesive in good conditions.

Note that in the semiconductor device, the thermoplastic resin preferably includes thermoset resin or a component of the thermoset resin.

By thus configured, the heat resistivity of the insulating film is improved to enhance the reliability.

Further, in the semiconductor device, a number of the semiconductor chips are integrally formed on a wafer, and the resin film can be provided so as to expose a dicing line of the wafer.

Although it is vary difficult to dice the resin together with the wafer made of silicon, by exposing the dicing lines 4 by removing the resin as described above, the wafer 1 can easily be diced as before by a dicing saw or the like.

Further, in the semiconductor device, a mark is formed on the semiconductor chip, and the resin film can be provided so as to expose the mark.

If various marks such as dicing mark or bonding mark are formed on the semiconductor chip, the semiconductor chip can be handled in the same manner as the ordinary semiconductor chip by exposing the marks.

According to another aspect of the invention, a mounting structure includes a substrate having a conductive section, and a semiconductor chip having a bump and bonded face-down on the substrate, wherein the conductive section of the substrate and the bump of the semiconductor chip are connected to each other directly without intervening the resin or indirectly via a conductive material.

According to the mounting structure of the semiconductor device, since no resin intervenes between the conductive section and the bump, the conductive section and the bump can be prevented from peeling off from each other, thus enhancing the mounting reliability and also reducing the contact resistance between the conductive section and the bump.

Further, the mounting structure of the semiconductor device includes a resin film formed between the semiconductor chip and the substrate except the connecting section between the conductive section of the substrate and the bump of the semiconductor chip.

By thus configured, since the substrate and the semiconductor chip are adhered with the resin, highly reliable mounting structure with no possibility of peeling off the semiconductor chip can be realized.

According to still another aspect of the invention, the mounting structure of the semiconductor device is formed by one of the manufacturing methods of the semiconductor device described above.

According to the mounting structure of the semiconductor device, since the mounting structure is formed by one of the methods of manufacturing the semiconductor device, the mounting cost can be reduced by eliminating any dedicated devices as described above. And further, since the resin can be avoided from entering between the conductive section and the bump, the mounting reliability can be enhanced, and the contact resistance between the conductive section and the bump. Still further, the resin forming the resin film can hardly run off to the sides of the semiconductor chip, high-density mounting can be realized.

BRIEF DESCRIPTION OF THE DRAWINGS

The invention will now be described with reference to the accompanying drawings, wherein like numbers refer to like elements, and wherein.

DESCRIPTION OF THE EMBODIMENTS

The invention will be explained hereinafter in detail. FIGS. 1A through 1F are schematic views for explaining processes of a mounting method of a semiconductor, which is an embodiment of the invention.

Figure 1A:
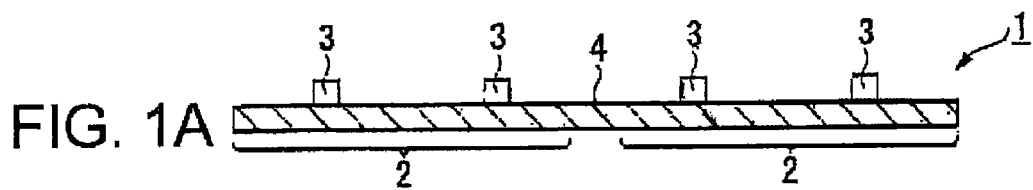
FIGS. 1A through 1F are schematic views for explaining processes of a method of mounting a semiconductor according to an embodiment of the invention.
Figure 1B:
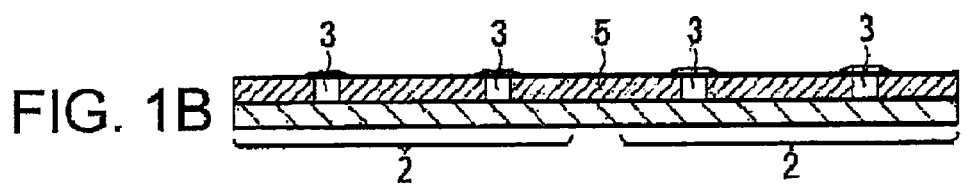

In the present embodiment, firstly a wafer 1 made of silicon is prepared as shown in FIG. 1A. In the wafer 1, there are a number of semiconductor chips 2 each equipped with various components formed thereon and further equipped with a number of bumps 3 formed on the side of the active surface. The bump 3 is formed of, for example, gold with an electrolytic plating process, or of a laminated structure of nickel and gold with an electroless plating process, and shaped like a cylinder or a prism having a height in a range of, for example, about 5 through 30 μm. Alternatively to the above, other known bumps such as a wire bump made by processing a gold wire to form a ball-shaped member, or a solder bump formed from solder can also be adopted.

In this case, the wafer 1 is to be diced into the individual semiconductor chips 2, and is provided with dicing lines 4 for obtaining discrete semiconductor chips 2 between the semiconductor chips 2, wherein no semiconductor components relating to the function of the semiconductor chips are provided to the dicing lines 4. Further, although not shown in the drawings, the wafer 1 is provided with various marks such as marks for dicing or marks for bonding formed in each of the semiconductor chips 2 or other areas. Although these marks are often formed of aluminum or copper used for forming circuits of the semiconductor chips, the material is not so limited, but any visible materials can be used therefor.

After preparing the wafer described above, as shown in FIG. 1B, a resin layer 5 is formed on a surface of the wafer 1 having the bumps 3 formed thereon by providing a resin material composed of photosensitive and thermoplastic resin or the precursor thereof, or a photosensitive thermoset resin adhesive sheet. In the present embodiment, it is assumed that the resin layer 5 is formed using the photosensitive and thermoplastic resin material. As the photosensitive and thermoplastic resin, polyimide resin, for example, can be cited. In case of using the polyimide resin, as a form of usage, it can be used by being dissolved with an appropriate solvent, for example. Further, as the precursor thereof, polyamic acid or amide-imide or the like can be cited. With respect also to the above materials, as a form of usage, they can be used by being dissolved with an appropriate solvent. Note that, regarding such resin materials, the form of usage can be a film other than the liquid, and in this case, the resin material can be used by previously being formed as a film or a sheet added with an appropriate add-in material if necessary.

Further, any kind of resin which can be photo-patterned and has adhesiveness thereafter can be used as the resin layer 5, and accordingly other known resins such as epoxy resin having thermoplasticity, BCB (benzocyclobutene) having thermoplasticity, or acrylic resin having thermoplasticity, can also be adopted. Further, thermoset resin or a component thereof can be included therein in order for enhancing the heat resistant property.

Further, in the embodiment of the invention, the photosensitivity of the resin material means that the resin material can be patterned by a photolithography technology using an exposure process and a development process, and inclusively expresses both cases of the positive type and the negative type.

If the form of usage of the resin material is a liquid form, the resin material composed of such resin or a precursor thereof is coated on the surface of the wafer 1 (the semiconductor chip) with the bumps 3 formed thereon by a known method such as a spin-coating process, a roll-coater process, or a dispensing process to form the resin layer 5. Further, if the film form or the sheet form is used, the resin layer 5 can be formed by simply sticking the resin material thereon. Here, as described below, the resin layer 5 is formed so that the thickness of the resin layer becomes substantially the same as the thickness of the bumps 3 after the resin layer is cured. Therefore, by thus forming the resin layer 5, the bumps 3 are covered by the resin layer 5.

Note that, in the resin layer 5, a liquid component of the liquid resin material is partially evaporated by a natural drying, but the resin material does not reach a state in which the resin material is completely cured with three-dimensional bridges, or the film or the sheet resin material which is only stuck thereon does not reach the cured state.

Under such a condition, the resin layer 5 is selectively exposed to an appropriate light source (an exposure source) using a mask (not shown). In this case, as described above, the photosensitivity type of the resin component of the resin material forming the resin layer 5 can be positive or negative.

Figure 1C:
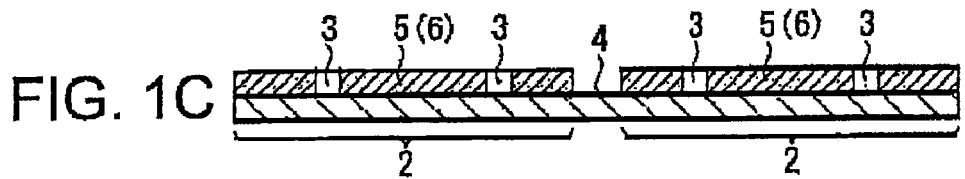

If the positive type is used, only sections right above the bumps 3 are selectively irradiated with the light to be exposed. Also in this case, sections right above the dicing lines 4, and further, sections right above the various marks such as dicing marks or bonding marks are irradiated with the light at the same time to be exposed. And, the resin in the exposed sections is selectively removed by subsequently executing the development process, thereby exposing the upper surfaces of the bumps 3 as shown in FIG. 1C, and further, the dicing lines 4 and the various marks (not shown). Note that, if the positive type of resin is used as described above, sections remain unremoved after executing the development process are in basically the same condition as the resin layer 5 before executing the exposure process. Therefore, especially in case a problem with using the liquid resin material for the resin layer 5 is posed in the development process, a provisional curing process such as drying can be executed before the exposure process described above is executed.

Further, if the photosensitivity type of the resin component of the resin material forming the resin layer 5 is negative, all of the area except the sections right above the bumps 3 is selectively irradiated with the light to be exposed. Also in this case, sections right above the dicing lines 4, and further, sections right above the various marks such as dicing marks or bonding marks are also excluded from the area selectively irradiated with the light to be exposed. And, similarly to the case with the positive type, the resin in the unexposed sections is selectively removed by executing the development process, thereby exposing the upper surfaces of the bumps 3 as shown in FIG. 1C, and further, the dicing lines 4 and the various marks (not shown). Note that, in case the negative type of resin is used as described above, if the resin is provisionally cured in the exposed area, the provisional curing process mentioned in the description for the positive type is not necessary. Note that, as a matter of course, the provisional curing process mentioned in the description for the positive type can be executed irrespective of whether or not the resin is provisionally cured by the exposure process.

Subsequently, the resin layer 5, from which desired sections are removed by the development process, is processed with a heat treatment process to be completely bridged three-dimensionally to turns the resin forming the resin layer 5 into a resin film 6 composed of thermoplastic resin. In other words, if the resin layer 5 is formed of photosensitive and thermoplastic resin, the solvent resolving the resin is removed by evaporation by the heat treatment process to form the resin film 6 formed of cured one of the thermoplastic resin such as polyimide resin which is a substantial component thereof. In contrast, if the resin layer 5 is composed of, for example, the precursor of the polyimide resin such as polyamic acid or amide-imide, a polymerization reaction such as dehydrating condensation is caused by the heat treatment process to form the resin layer 6 composed of, for example, cured one of the polyimide resin. Therefore, conditions of the heat treatment such as temperature or a period of time are appropriately determined by a pilot study or the like in accordance with a type or a form of the resin layer 5.

The resin film 6 thus formed is thermoplastic and so take a cured form at room temperature, and is arranged to be soften and then melted in temperatures higher than the melting point determined by the composition thereof and so on. The resin film 6 is wetly spread on the surface of the substrate by melting to exert is adhesiveness. The melting start point of temperature changes in accordance with the composition, the polymerization degree, the add-in materials of the selected thermoplastic resin, as described above. It is preferable to select or arrange the materials so that the melting point becomes in a range of about 50° C. through 400° C., for example. This is because, with the melting point of lower than 50° C., if a sub-assembly composed of the substrate and the semiconductor chip 2 mounted thereon, described later, is exposed in a hard temperature condition in use, the resin film may partially be melted to be degraded in bonding force to cause loose connection between the bump 3 and the conductive section of the substrate. Further, with the melting of higher than 400° C., when the semiconductor chip 2 is mounted on the substrate as described below, the element section of the semiconductor chip 2 may be damaged by the heat treatment process for melting the resin film 6.

After changing the resin layer 5 into the resin film 6, the cured form of the thermoplastic resin, the dicing process is executed along the dicing lines 4 exposed in the previous process to separate the semiconductor chips 2. In this case, although it is vary difficult to dice the resin together with the silicon (wafer 1), the dicing lines 4 are exposed by removing the resin as described above, and therefore, the wafer 1 can easily be diced as before by a dicing saw or the like. Further, since the dicing lines 4 are exposed to be visible, positioning and so on in the dicing process can also be executed easily as before. Further, in this case, by using the dicing marks in the various marks described above as references, the dicing process can easily and precisely be executed. As described above, since these marks necessary for recognition can be provided in the openings of the resin film made by partially removing the resin, the marks can directly be seen. Therefore, by using the marks as reference marks for positioning, positioning of high precision can be executed. These marks can also be used in a following mounting process.

Figure 1D:
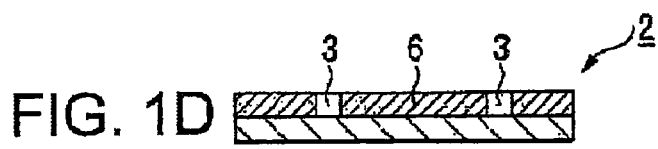
Figure 1E:
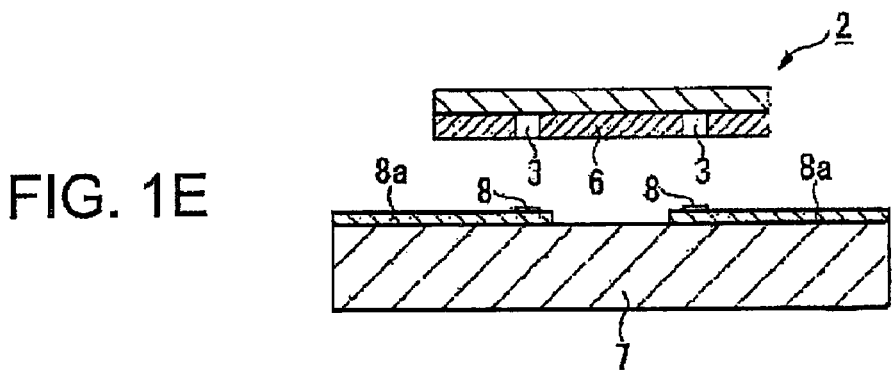
Figure 1F:
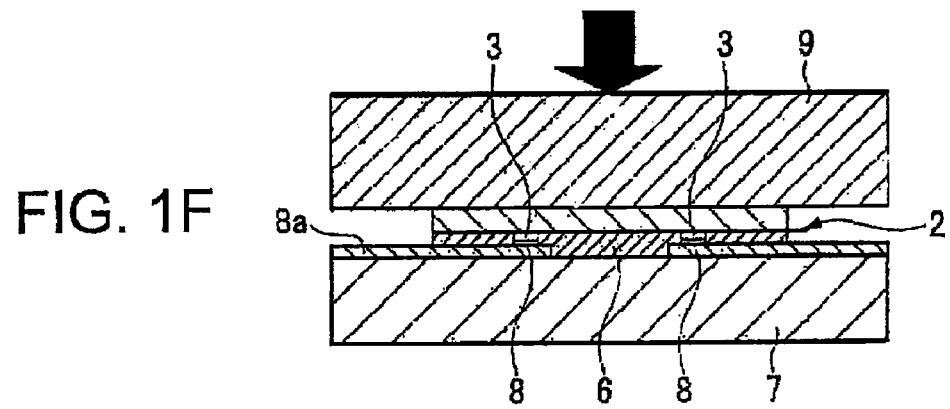

Subsequently, the discrete semiconductor chips 2 are arranged on the substrate 7 previously prepared as shown in FIG. 1E and positioning is then executed. As the substrate 7, various substrates such as a glass substrate, a ceramic substrate, a hard substrate or a flexible substrate both made of resin, can be used. However, since the surface thereof is preferably flat, a grass substrate of a ceramic substrate is preferably used. The substrate 7 is previously provided with lands (conductive sections) 8 corresponding to the positions of the bumps 3 of the semiconductor chips 2 to be mounted thereon, and the lands 8 are formed to be connected to wiring 8*a*.

Therefore, when positioning the semiconductor chips 2 on the substrate 7, the bumps 3 of the semiconductor chips 2 are abutted on the lands 8. In this case, by using the bonding marks in the various marks exposed as described above, the positioning process can easily and precisely be executed. After executing the positioning process and mounting the semiconductor chips 2 on the substrate 7, the substrate 7 and the semiconductor chips 2 are heated and pressurized by a bonding tool. Note that the bonding tool is composed of a stage (not shown) for mounting the substrate 7 and so on and a pressurizing heater 9 shown in FIG. 1F.

The face-down bonding process using such a bonding tool is executed by mounting the substrate 7 and the semiconductor chips 2 positioned to each other on the stage, and then pressurizing the semiconductor chip 2 side thereof with the pressurizing heater 9. Note that the positioning of the semiconductor chips 2 to the substrate 7 can be executed on the stage. In this case, the stage can be provided with a heating device such as a heater to heat the resin film 6 by heat conduction through the substrate 7. Further, the pressurizing heater 9 is provided with a heating device such as a heater inside or on the surface thereof, and is connected to an air cylinder or a hydraulic cylinder so as to elevate, and arranged to generate pressure by moving down with the hydraulic cylinder.

The pressurizing heater 9 thus configured holds the substrate 7 and the semiconductor chips 2 mounted on the stage (not shown) together with the stage, and in this condition, pressurizes the semiconductor chip 2 side thereof with an appropriate pressure set previously. Further, in this case, the stage and the heating device of the pressurizing heater 9 is set to a condition suitable for heating the resin film 6 to a temperature of melting and soften the resin film 6. In other words, since the melting point of temperature of the resin film 6 is previously determined as described above, the heating device is set to be at a higher temperature than the melting point. Note that it is sure that heating by the heating device can be started after starting pressurizing by the pressurizing heater 9. In this case, it is important to manage parallelism between the surface of the stage and the pressurizing heater, and flatness of the surface of the stage and the pressurizing heater.

By thus heating and pressurizing, the resin film 6 formed on the surface on which the bumps 3 of the semiconductor chips 2 are formed is heated with the heat conduction from the heating device described above, and then melted to be softened. Since the semiconductor chip 2 is pressurized by the pressurizing heater 9 in the meantime, the bumps 3 are maintained to abut on and pressurize the lands 8 of the substrate 7. And, after executing the heating and pressurizing process for a predetermined period of time, heating by the pressurizing heater 9 and heating from the stage are stopped to cool the semiconductor chip naturally while maintaining the pressure by the pressurizing heater 9. Note that a cooling device can be provided to the pressurizing heater 9 or the stage for enhancing cooling of the semiconductor chips 2 after stopping heating.

By thus stopping heating and then cooling the semiconductor chips 2, the resin film 6 is resolidified from the melted state. In this case, the resin film 6 is wetly spread on the surface of the substrate to exert adhesiveness when resolidified from the melted state, and is adhered not only to the semiconductor chips 2 but also to the substrate 7, as a result, makes the semiconductor chips 2 be adhered, namely fixed to the substrate 7. And, since the resin film 6 shrinks when it is resolidified after being melted, the substrate 7 and the semiconductor chips 2 are pulled in each other by the shrinking force. Therefore, the lands 8 of the substrate 7 and the bumps 3 of the semiconductor chips 2 are joined to each other in an adhered state by the shrinking force, thus electrical connections are provided in good conditions. In this case, since the resin film 6, the insulating film, does not exist between the bumps 3 and the lands 8, the electrical connections between the bumps 3 and the lands 8 can easily be established by being pressed with only weak pressure, and stable electrical connections can be maintained after the mounting process. This point is an advantage of the embodiment of the invention, in which the embodiment of the invention is greatly different from a conventional boding process using resin.

Figure 2:
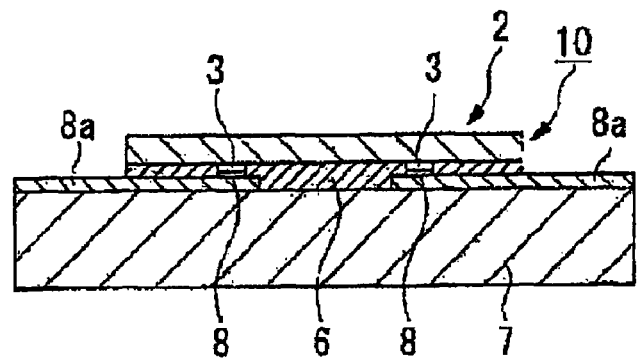
FIG. 2 is a schematic view showing a mounting structure of a semiconductor device according to an embodiment of the invention.

After then, the pressurizing heater 9 is moved up, and the substrate 7 is removed from the stage, thus obtaining a mounted body (a mounted structure) 10 of the semiconductor device formed by mounting the semiconductor chips 2 on the substrate 7 as shown in FIG. 2.

In such a mounting method of the semiconductor chips 2 on the substrate 7, namely the method of mounting the semiconductor device, since the resin film 6 functioning as an adhesive is formed on the semiconductor chip 2 side thereof, the resin layer 5 for forming the resin film 6 can be formed by a method using a general-purpose device such as a spin-coating process, and accordingly, no dedicated device is required, thus reducing the mounting cost.

Further, since the semiconductor chip 2 is directly bonded face-down to the substrate 7 with the upper surface of the bumps 3 exposed to electrically connect the bumps 3 to the lands 8 of the substrate 7, the resin is prevented from entering between the lands 8 and the bumps 3, and accordingly, the lands 8 and the bumps 3 can be prevented from peeling off from each other, thus enhancing the mounting reliability and also reducing the contact resistance between the lands 8 and the bumps 3. The resin contributing to adhering between the semiconductor chips and the substrate continues to function as so-called underfill and absorbs the difference in temperature between the semiconductor chips and the substrate, thus contributing to enhancing the reliability of the device as a whole. As described above, the underfill process can also be completed simultaneously to the process for establishing electrical connections. This point is also an advantageous process of the present embodiment of the invention in comparison with a flip mounting process of a conventional solder connection method.

Further, since the semiconductor chips 2 are bonded face-down with the resin film 6 composed of thermoplastic resin functioning as an adhesive, there is very little possibility for the resin forming the resin film 6 to run off to the sides of the semiconductor chips 2 (because, in the nature of the configuration, the size of the resin film 6 is not larger than the size of the semiconductor chip, and an amount of the softening flow is small on or above the Tg point because of the thermoplastic film, and accordingly, volume of the adhesive running off aside can fully be controlled by a photolithography process by controlling the thickness and the area of the adhesive), and accordingly, no substantial dead space is created on the substrate 7 to shorten the distances between adjacent components, thus realizing the high-density mounting.

Further, since anisotropic conductive paste (ACP), anisotropic conductive film (ACF), nonconductive paste (NCP), or nonconductive films (NCF) used in a conventional method is not used, such an adhesive can be omitted, and a preparing process therefor can also be omitted, thus making it possible to reduce the cost of the mounting process. Further, defects caused by the adhesive such as ACF can be eliminated, and the contact resistances between the lands 8 and the bumps 3 can be suppressed to a low level in comparison to the case with ACF. This is because, in the case with ACF or the like, the lands 8 and the bumps 3 are connected via conductive fine particles which makes the contact resistances larger by resistances of the conductive fine particles, and accordingly, by eliminating such conductive fine particles therebetween, the increase in the resistances can be suppressed.

In addition, in the step of face-down bonding the semiconductor chip 2, to which the resin film 6 has been applied by the above method, on the substrate 7, novel mounting device and mounting process are not particularly needed but conventional mounting device and mounting process can be used without modification. Therefore, new investments are not required and thus cost-up can be avoided.

Furthermore, the process for forming the bumps 3 can be adopted as is conventionally done without modification. Moreover, dicing of the wafer 1 and check of the semiconductor chip 2 can also be carried out as is conventionally done.

Further, regarding the mounted body (the mounted structure) 10, the mounting cost is reduced because no dedicated device is required as described above, and since there is very little chance for the resin forming the resin film 6 to run off to the sides of the semiconductor chips 2, the high-density mounting becomes possible. Still further, since no resin is intervening between the lands 8 and the bumps 3, a possibility of peeling-off between the lands 8 and the bumps 3 can be eliminated, thus the mounting reliability can be enhanced, and the contact resistances between the lands 8 and the bumps 3 such as initial resistances can also be reduced.

Note that the resin film 6 preferably has a thermal expansion coefficient similar to the thermal expansion coefficient of the substrate 7, because, by having such a thermal expansion coefficient, the peeling-off of the semiconductor chips 2 from the substrate 7 caused by the difference in the thermal expansion coefficient can be prevented, thus enhancing the mounting reliability.

Further, in the present embodiment, mounting of the semiconductor chips 2 on the substrate 7 and connection (electrical conduction) of the lands 8 and the bumps 3 are executed using the resin film 6, however, the invention is not limited to such an embodiment, but can use a brazing filler metal (a soft brazing filler metal) such as lead-free solder so as to be put between the lands 8 and the bumps 3.

Namely, when the semiconductor chips 2 provided with the resin film 6 formed thereon are bonded face-down to the substrate 7 to electrically connect the bumps 3 of the semiconductor chips 2 to the lands 8 of the substrate 7, the bumps 3 and the lands 8 can be electrically connected via a brazing filler metal such as lead-free solder previously provided to at least one of the bumps 3 and the lands 8.

In the embodiment shown in FIGS. 1A through 1F, the lands 8 of the substrate 7 and the bumps 3 of the semiconductor chips 2 are pulled in each other by the adhesive force of the resin film 6, namely the shrinking force caused when the melted resin film 6 is solidified, and are connected in a pressure welding condition. In contrast, in the present embodiment in which the lands 8 and the bumps 3 are bonded via a brazing filler metal, stronger bonding (metal bonding) can be obtained. Further, since the brazing filler metal can be melted in the heating process for melting the resin film 6, and then solidified as it is in the cooling process (the natural cooling process) for resolidifying the resin film 6, an additional load is hardly caused in the processes by adding the brazing filler metal, thus a decrease in the productivity and an increase in the cost can be prevented while obtaining the above advantages.

Note that as the brazing filler metal, metals melted at a temperature not higher than the melting point of the resin film 6 or metals having low melting points such as bismuth alloys or indium alloys are preferably used, and especially, those having melting points near to the melting point of the resin film 6 are further preferably used for further simplifying the melting process by the heating process and the resolidifying process. Further, as the brazing filler metal, a combination of gold plated on the bumps and tin plated on the lands of the substrate, a combination (gold-gold bonding) of gold plated on the bumps and gold plated on the lands of the substrate, or a form using gold-ITO (indium tin oxide) bonding can be used. If a metal melted at a temperature not higher than the melting point of the resin film 6 is not used in the above case, a surface activation bonding technology using plasma or an ultrasonic bonding technology can be used in conjunction therewith. The above processes are effective not only for bonding the bumps with the lands on the substrate, but also for means to enhancing adhesiveness between the resin film and the surface of the substrate.

Figure 3:
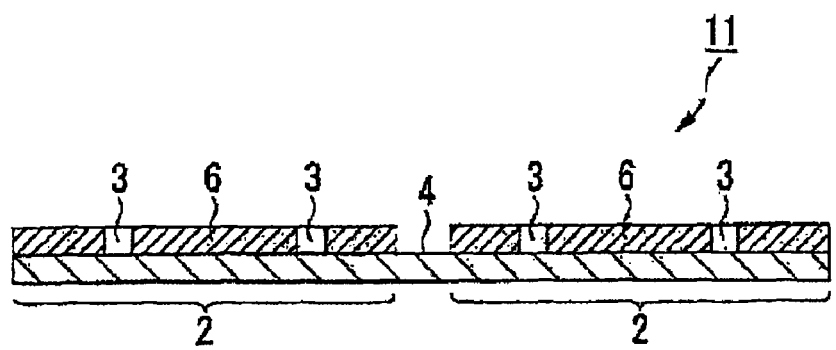
FIG. 3 is a schematic view showing a configuration of a semiconductor device according to an embodiment of the invention.

Further, especially in the wafer 1 shown in FIG. 1C, namely a semiconductor device 11 of the embodiment of the invention shown in FIG. 3, since the resin film 6 is provided so as to expose the dicing lines of the wafer 1, the wafer 1 can easily be diced as before by an existing dicing saw. As described above, since these marks necessary for recognition can be provided in the openings of the resin film made by partially removing the resin, the marks can directly be seen. Therefore, by using the marks as reference marks for positioning, positioning of high precision can be executed. These marks can also be used in a following mounting process.

Figure 4:
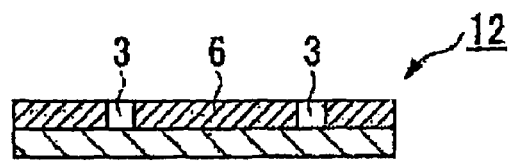
FIG. 4 is a schematic view showing a configuration of a semiconductor device according to an embodiment of the invention.

Further, in the discrete semiconductor chip 2 shown in FIG. 1D, namely a semiconductor device 12 according to an embodiment of the invention shown in FIG. 4, by functioning the resin film 6 composed of thermoplastic resin as an adhesive, namely by cooling to resolidify the resin film 6 after heating to melt the resin film 6, the semiconductor chip 2 can be bonded face-down on the substrate 7. Further in this case, since there is a very little chance for the resin composing the resin film 6 to run off to the sides of the semiconductor chip 2, a dead space can hardly be created on the substrate 7, therefore, by using the semiconductor device 12, the high-density mounting can be realized.

Still further, the resin layer 5 for forming the resin film 6 can be formed by a method using multi-purpose devices such as a spin-coating process, and accordingly, by using the semiconductor device 12, any dedicated devices for mounting can be eliminated, thus making the mounting cost be reduced.

Further, since the upper surface of the bump 3 of the semiconductor 2 is exposed, by bonding the semiconductor chip 2 face-down directly on the substrate 7 to electrically connect the bump 3 to the land 8 of the substrate 7, the resin can be prevented from entering between the land 8 and the bump 3. As a result, peeling-off of the land 8 from the bump 3 can be prevented to enhance the reliability in mounting, and the contact resistance between the land 8 and the bump 3 can also be reduced.

Note that in the semiconductor device 12, especially in case any marks are provided to the semiconductor chip 2, the resin film 6 is preferably provided so as to expose the marks.

If various marks such as dicing marks or bonding marks are provided to the semiconductor chip 2, by exposing the marks, the semiconductor chip 2 can be handled in the same manner as the ordinary semiconductor chip 2, and accordingly, easy handling thereof can be achieved.

Further, in the semiconductor device 12, the thickness (height) of the resin film 6 is arranged to be substantially the same as the height of the bump 3 as described above. With the resin film 6 a little bit thicker (higher) than the bump 3, when the semiconductor device 12 (the semiconductor chip 2) is mounted on the substrate 7, bubbles existing in the adhesive surface of the resin film 6 can surely be ejected, and accordingly, the substrate 7 and the resin film 6 are adhered in a better condition, thus enhancing the reliability in mounting.

Further, with the resin film 6 a little bit thinner (lower) than the bump 3, the bump 3 is sufficiently exposed from the resin film 6, and accordingly, a problem that the resin film 6 in the periphery of the bump enters between the bump 3 and the land 8 can surely be prevented, thus the electrical connection between the bump 3 and the land 8 can be made more stable, and the contact resistance therebetween can also be prevented from increasing. Note that, especially if a flexible substrate made of resin or the like is adopted as the substrate 7, it is preferable that the bump 3 is sufficiently exposed as mentioned above to make the electrical connection between the bump 3 and the land 8 more stable because the substrate 7 sags to some extent in the pressurizing and heating process.

Still further, if the thickness (the height) of the resin film 6 is arranged to be the same as the height of the bump 3, both of the advantage of the case with the film a little bit higher and the advantage of the case with the film a little bit lower can be expected. The selection can be made in accordance with the characteristics of significant concern.

Note that the invention is not limited to the embodiments described above, but various modifications can be made within the spirit or the scope of the invention. For example, although the resin layer 5 is formed using a photosensitive and thermoplastic resin material in the above embodiments, the resin layer 5 can also be formed using a photosensitive and thermoset resin adhesive sheet alternatively thereto. The photosensitive and thermoset resin adhesive sheet can be adhered to the chip at a low temperature (in a range of 50 through 100° C., for example), and can be patterned by a photolithography technology because of its photosensitive property, and further expresses adhesiveness and thermoset property after being patterned.

Figure 5A:
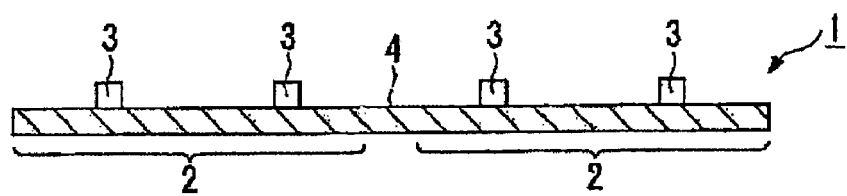
FIGS. 5A through 5C are schematic views for explaining a modified example of a mounting method according to an embodiment of the invention.
Figure 5B:
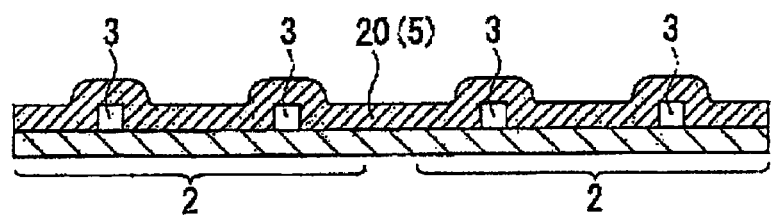

In order to form the resin layer 5 using the photosensitive and thermoset resin adhesive sheet described above, the silicon wafer 1 is prepared as shown in FIG. 5A, and subsequently, the photosensitive and thermoset resin adhesive sheet 20 is adhered to the surface provided with the bumps 3 formed thereon using a heat roll laminator or the like as shown in FIG. 5B. Here, the photosensitive and thermoset resin adhesive sheet 20 is covered by a release sheet (not shown) on one surface thereof, and is adhered to the wafer 1 with the other surface thereof and forms the resin layer 5 by removing the release sheet. Here, the resin layer 5 is simply adhered thereto, and therefore, does not reach the cured state.

Figure 5C:
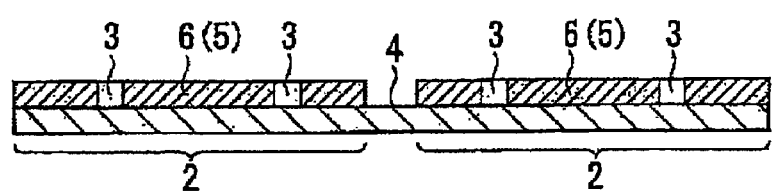

After thus forming the resin layer 5 using the photosensitive and thermoset resin adhesive sheet 20, it is selectively exposed to an appropriate light source (exposure source)

using the mask (not shown) similarly to the case shown in FIGS. 1A through 1F. After thus executing the exposure process, a preliminary heating process is executed if necessary, and then a development process using methyl ethyl ketone (MEK) or the like is executed after provisionally curing the resin, and the upper surfaces of the bumps 3 are exposed as shown in FIG. 5C, and further, the dicing lines 4 and the various marks (not shown) are then exposed. Note that in the example using the photosensitive and thermoset resin adhesive sheet 20, the patterned resin layer 5 obtained by the developing process becomes the adhesive resin film 6 in the embodiment of the invention.

After then, similarly to the case shown in FIGS. 1A through 1F, the resin film 6 is used to be functioned as an adhesive to bond the discrete semiconductor chips 2 face-down on the substrate 7. Specifically, the resin film 6 (the photosensitive and thermoset resin adhesive sheet 20) is hot-cured by heated while pressurized using the bonding tool described above at 150° C. for about one hour, for example.

As described above, if the resin layer 5 is formed using the photosensitive and thermoset resin adhesive sheet 20, the resin film 6 having adhesiveness can directly be formed therefrom, therefore, the processes can be simplified in comparison to the embodiment shown in FIGS. 1A through 1F.

What is claimed is:

1. A method of manufacturing a semiconductor device, comprising:
   forming a resin layer on a surface of a semiconductor chip, the surface is provided with a bump formed thereon, the resin layer having photosensitivity and adhesiveness;
   exposing an upper surface of the bump by removing a part of the resin layer right above the bump by exposing and then developing the resin layer; and
   bonding the semiconductor chip provided with a resin film formed of the resin layer face-down to a substrate such that the bump of the semiconductor chip and a conductive section of the substrate are electrically connected, with the resin film functioning as an adhesive,
   wherein a number of the semiconductor chips are integrally formed on a wafer, a part of the resin layer right above a dicing line of the wafer is removed simultaneously in the exposing step to expose the dicing line.

2. The method of manufacturing a semiconductor device according to claim 1, wherein a resin forming the resin layer is a photosensitive and thermoplastic resin or a precursor of the photosensitive and thermoplastic resin, and further comprising:
   heating the resin layer to change the resin forming the resin layer into the resin film formed of a thermoplastic resin.

3. The method of manufacturing a semiconductor device according to claim 2, wherein at least one of a photosensitive and thermoplastic resin forming the resin layer and a material of the photosensitive and thermoplastic resin including a precursor of the photosensitive and thermoplastic resin includes one of a thermoset resin and a component of the thermoset resin.

4. The method of manufacturing a semiconductor device according to claim 1, wherein the resin layer is formed of a photosensitive and thermoset resin adhesive sheet.

5. The method of manufacturing a semiconductor device according to claim 1, wherein a mark is formed on the semiconductor chip, a part of the resin layer right above the mark on the semiconductor chip is removed simultaneously in the exposing step to expose the mark.

* * * * *